(12) United States Patent
Rupert

(10) Patent No.: US 8,085,055 B2
(45) Date of Patent: Dec. 27, 2011

(54) BRANCH CURRENT MONITORING SYSTEM

(75) Inventor: Matthew Rupert, Amity, OR (US)

(73) Assignee: Veris Industries, LLC, Portland, OR (US)

( * ) Notice: Subject to any disclaimer, the term of this patent is extended or adjusted under 35 U.S.C. 154(b) by 103 days.

(21) Appl. No.: 12/798,731

(22) Filed: Apr. 8, 2010

(65) Prior Publication Data

US 2010/0264944 A1 Oct. 21, 2010

Related U.S. Application Data

(60) Provisional application No. 61/214,245, filed on Apr. 20, 2009.

(51) Int. Cl.
*G01R 27/08* (2006.01)
*G01R 11/32* (2006.01)
*G01R 15/18* (2006.01)

(52) U.S. Cl. ............... 324/706; 324/142; 324/117 R

(58) Field of Classification Search ......... 324/126–127, 324/117 R, 117 H, 141, 706, 648, 764.01; 713/323, 300, 321; 714/22–24; 327/33, 327/545, 205

See application file for complete search history.

(56) References Cited

U.S. PATENT DOCUMENTS 4,058,768 A * 11/1977 Milkovic .................. 324/142
4,475,081 A * 10/1984 Kobayashi ............... 324/142

* cited by examiner

*Primary Examiner* — Huy Q Phan
*Assistant Examiner* — Tung X Nguyen
(74) *Attorney, Agent, or Firm* — Chernoff Vilhauer McClung & Stenzel, LLC

(57) ABSTRACT

A power monitoring system that reduces the need for transient voltage suppressors while using current transformers on an associated support operating using a current mode.

6 Claims, 9 Drawing Sheets

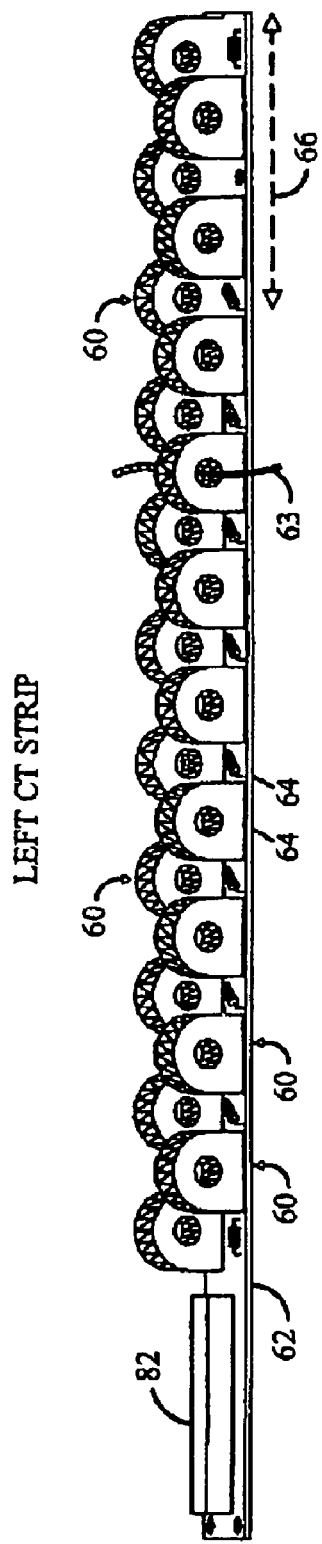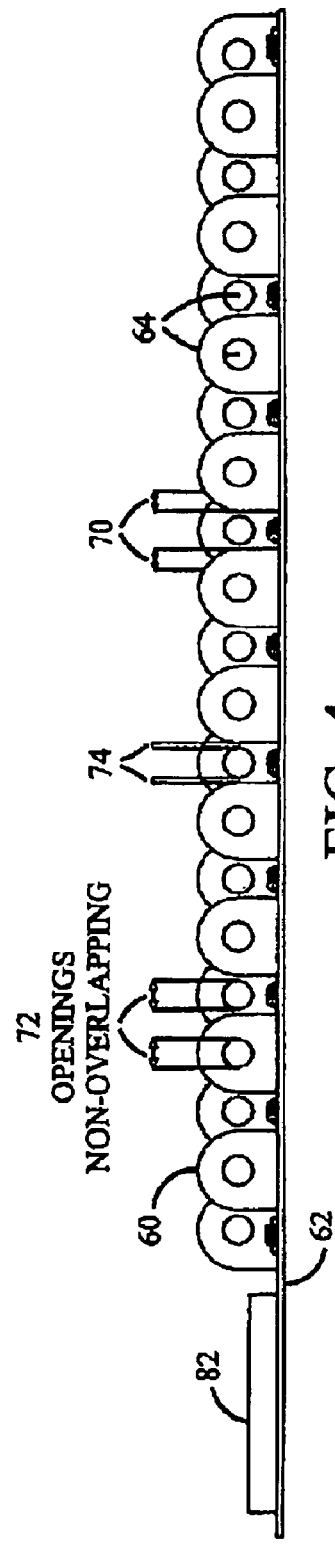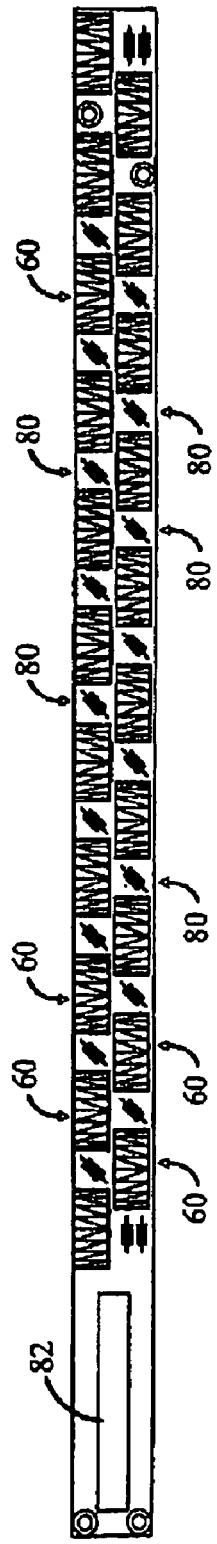

BRANCH CURRENT MONITORING SYSTEM

CROSS-REFERENCE TO RELATED APPLICATIONS

This application claims the benefit of Provisional App. No. 61/214,245, filed Apr. 20, 2009.

BACKGROUND OF THE INVENTION

The present invention relates to a branch current monitoring system.

Referring to FIG. 1, many electrical power distribution systems include a panel enclosure 10 into which is provided electrical power using one or more sets of wires 12. The electrical power may have any voltage, any current, and any number of phases (e.g., single phase, two phases, or three phases). Each phase of the electrical power to the power panel is normally provided to a separate bus bar 14a, 14b, and 14c, which are normally elongate conductors within the power panel 10. A plurality of circuit breakers 16a, 16b, and 16c, etc., which trip or otherwise selectively disconnect electrical power, are electrically interconnected between one or more of the bus bars 14a, 14b, and 14c, and respective loads 18 external to the power panel 10. In many power panels 10 the circuit breakers 16 are vertically aligned in one or more strips. When the load 18 interconnected to a respective circuit breaker 16 within the power panel 10 draws excessive electrical current then the circuit breaker 16 trips or otherwise disconnects the electrical power to the load 18. In this manner, if a load shorts and thereafter draws excessive current then the circuit breaker will trip. Frequently the load will be a three-phase load having three wires provided thereto, with one or more corresponding circuit breakers.

In many business environments a set of electrical loads, such as motors, lighting, heating units, cooling units, machinery, etc., may be electrically interconnected to one or more circuits, each of which may be a single phase or multi-phase. Obtaining the total power usage of the business may be readily obtained by reading the power meter provided by the power utility. The power meter is normally electrically interconnected between the power panel and the power utility. In many circumstances, it is desirable to monitor the power consumption of individual loads or groups of loads. The use of power meters permits effective monitoring of the power consumption of particular loads. Also, a set of power meters permits effective sub-metering of different loads, buildings, or groups of loads to attribute and monitor the power usage of the business. For example, the power sub-metering may be used to attribute the power costs charged by the utility to different buildings, departments, or cost centers. The traditional approach to monitoring such power usage is to install a power meter at a location proximate the load itself. To install a typical power meter on a three phase load, a current sensor is located around each wire of the three phases and a voltage connection is electrically interconnected to each wire. Such a power meter is available from Veris Industries, LLC under the name H8035 Power Meter. Unfortunately, it is burdensome to interconnect a significant number of power meters and in particular the voltage connections to the wires, especially if an interconnection to the wires are not readily available. In addition, it is burdensome to interconnect the output of the power meters, if any, to a computer network because of the need to provide communication wiring or other wireless communication channels to each of the remotely located power meters. Also, installing the power meters requires significant expense for the technician to locate a suitable location near each device, in addition to the further expense of servicing the installed power meters.

Referring to FIG. 2, to monitor the power provided to a particular load from one or more individual circuit breakers 16 a respective current sensor 20 may be interconnected to the wire on the load side of the respective circuit breaker 16. Typical circuit breakers may include a single phase, two phases, or three phases. The outputs 22 of each of the current sensors 20 may be interconnected to a power monitor 24. The current sensors 20 may be interconnected to one or more power monitors. Also, the current sensors 20 may likewise be daisy chained together, or interconnected to the power monitor(s) in any other suitable manner. An electrical interconnection from each bus bar to the power monitor(s) normally includes wires 23a, 23b, 23c to sense the voltage and its corresponding phase relationship. Alternatively, the voltage potential and phase relationship for each phase may be sensed from locations other than the bus bars 14a, 14b, and 14c, such as for example, a wire provided to a load, the load side of a circuit breaker, the utility side of a circuit breaker, a capacitive coupling to the voltage potential, or the wire connection from the utility. It is to be understood that the power monitor may calculate power based upon a single phase, two phases, and/or three phases, etc., as desired. In essence, the power monitoring system may use the electrical path from the power monitor 24 to the bus bars (or otherwise) of at least one of the phases for a plurality of different loads. Typically, the power is calculated by multiplying the voltage, corresponding current, and corresponding power factor which relates to the phase relationship between the voltage and current.

It takes considerable time to install, at significant expense, all of the current sensors 20 and the available space within the power panel 10 may be insufficient for the desired number of current sensors. Also, the limited space available along the circuit breakers 16 may result in significant difficulty installing the current sensors 20, thus requiring lateral spacing of the current sensors and bending the wires from the circuit breakers to different locations within the power panel 10 in an attempt to locate sufficient available space for the current sensors 20. In addition, the large number of wires 22 from the current sensors 20 to the power monitor 24 may require considerable space within the power panel 10. Further, because of the significant number of individual wires 22 an installer has a significant tendency to interconnect the wires 22 to improper places within the power current monitor 24 and in particular to mismatch pairs of wires 22 from the same current sensor 20 rending the current sensors 20 ineffective. Moreover, it is problematic to ensure that the wires 22 indicated by the installer that relate to a particular current sensor 20 actually are interconnected to the desired current sensor 20. In summary, the potential installation problems are significant, especially when install by untrained technicians.

Referring to FIG. 3, a set of sensors 60 may be supported by a support 62 which maintains the current sensors 60 in a fixed spatial relationship with respect to one another. Preferably the support 62 is rigid or semi-rigid, while a flexible support 62 that was installed on a rigid or a semi-rigid supporting member(s) may likewise be used. The sensors 60 are preferably current sensors, or alternatively, other types of sensors may be used. The sensors 60 are preferably wire wound torodial coils on a metallic or non-metallic core enclosed within a plastic housing through which a wire 63 may be extended, and the housings are at least partially surrounding the respective coil. Changing current within the wire 63 induces a changing magnetic field around the wire 63. The changing magnetic field in turn induces a changing current within the wire wound torodial coil. The changing current within the torodial coil may be used directly or converted to any suitable signal, such as for example, a voltage signal, or a different current signal.

The openings 64 defined by the sensors 60 are preferably oriented in a substantially parallel relationship with respect to each other and/or oriented in a substantially perpendicular relationship with respect to the longitudinal axis 66 of the support 62 or otherwise the general alignment of the sensors. Preferably, one set of the aligned sensors have a first linear arrangement and another set of the aligned sensors have a second linear arrangement, which may be parallel to each other. Also, preferably at least two of the aligned sensors have a first linear arrangement and at least two others of the aligned sensors have a second linear arrangement. A single aligned set of sensors 60 may be used or more than two sets of sensors 60 may be used, as desired.

Referring also to FIG. 4, the sensors 60 may be arranged such that the housings surrounding the current sensors have an overlapping region 70 in a substantially perpendicular direction with respect to the longitudinal axis of the support 62 and/or general alignment of the sensors. Preferably, the openings 64 defined by the sensors 60 are in a non-overlapping relationship 72 with respect to one another and a non-overlapping relationship 74 with respect to other housings. This permits the sensors to be arranged in a more compact arrangement within the power panel.

Referring also to FIG. 5, a respective transient voltage suppressor 80 may be interconnected in parallel across the output terminals of each sensor 60. The transient voltage suppressors 80 limits the voltage build up at the terminals of the sensors 60, which may occur if the sensors are sensing a changing magnetic field while the terminals of the sensors 60 are open circuited. This decreases the likelihood that technicians will be the recipient of an unanticipated electrical shock.

Referring to FIG. 6, the current sensors 60 are preferably arranged in a spatial arrangement such that the openings 64 defined by the current sensors 60 are in a substantially directly opposing relationship with respect to the circuit breakers 16. In other words, the each of the openings 64 is opposing a respective circuit breaker 16. In this manner, the wires from the circuit breakers 16 may be readily routed through a respective sensor 60.

Referring to FIG. 7, during normal installation the support 62 is initially affixed within the power panel in an adjacent spaced apart relationship with respect to a set of circuit breakers 16. A support may be located on both sides of a set of circuit breakers 16, if desired. Another support more suitable for the right hand side of the circuit breakers may also be used. Then, the wires from the loads are passed through the respective sensors and interconnected to a respective circuit breaker 16. In addition, the wires 23a, 23b, and 23c, for sensing the voltage potentials on the bus bars are likewise electrically interconnected. In this manner, the installation of the circuit breakers and the power monitor is efficient, less expensive, economical, and the sensors are in a suitable position with respect to the respective circuit breakers. The support 62 may be suitable for supporting a set of electrical traces that interconnect the sensors 60 to a connector 82. A cable 84 interconnects each connector 82 to a power monitor 24. While such a set of supports 62 with respective sensors 60 are suitable for use with new installation, it is difficult to install such a set of sensors 60 to an existing set of circuit breakers with wires already installed. To permit the sensors 60 to be readily interconnected with wires already interconnected to the circuit breakers 16 the sensors 60 may be constructed in a split-core manner. In this manner, the opening 64 may be opened, the wire inserted therein, and the opening 64 closed around substantially all of the wire.

To provide effective monitoring of the power usage used by the loads, the power monitor 24 may monitor the current levels of each of circuit breakers 16 together with the associated voltage potential and phase relationship.

The power monitor 24 may likewise be used to monitor the load balance between the different phases of the power panel 10. Frequently, the circuit breakers may be interconnected to a single phase when the loads require 120 volts, interconnected to two phases when the loads require 240 volts, and interconnected to three phases when the loads require three phase power. For example, the first phase of the power panel 10 may be supplying 70 amps, the second phase of the power panel 10 may be supplying 30 amps, and the third phase of the power panel 10 may be supplying 150 amps. This significant imbalance in the current supplied by the different phases is sub-optimal. For example, the greater the current levels the greater the voltage drop from the power source to the power panel, which may result in significant variations in the voltage levels provided to the power panel from the three phase power source. By monitoring the current (or power) provided from each phase using the sensors, the loads may be redistributed between the different phases to re-balance the loads.

What is desired, therefore, is an effective power monitoring system.

BRIEF DESCRIPTION OF THE DRAWINGS

FIG. 3 illustrates a perspective view of a support for a set of current sensors.
FIG. 4 illustrates a side view of the support and sensors of FIG. 3.
FIG. 5 illustrates a top view of the support and sensors of FIG. 3.

DETAILED DESCRIPTION OF THE PREFERRED EMBODIMENT

Upon reflection of the existing systems, the connector associated with the power meter board includes a lot of pins, each of which is relatively expensive and requires a corresponding cable with a large matching number of electrical paths. In addition, the connector also includes a burden resistor for each corresponding electrical paths associated with a current transformers. In total, the connectors, cables, and burden resistors require substantial space at significant expense.

Each of the current sensors on the supports includes an associated transient voltage suppressor. The transient voltage suppressors suppress voltage spikes from the open ended current transformers, which could be over 1,000 volts, thereby increasing safety. Unfortunately, the transient voltage suppressors are relatively expensive, especially with a corresponding transient voltage suppressor for each current transformer. The support preferably includes four or more current transformers.

Figure 1:
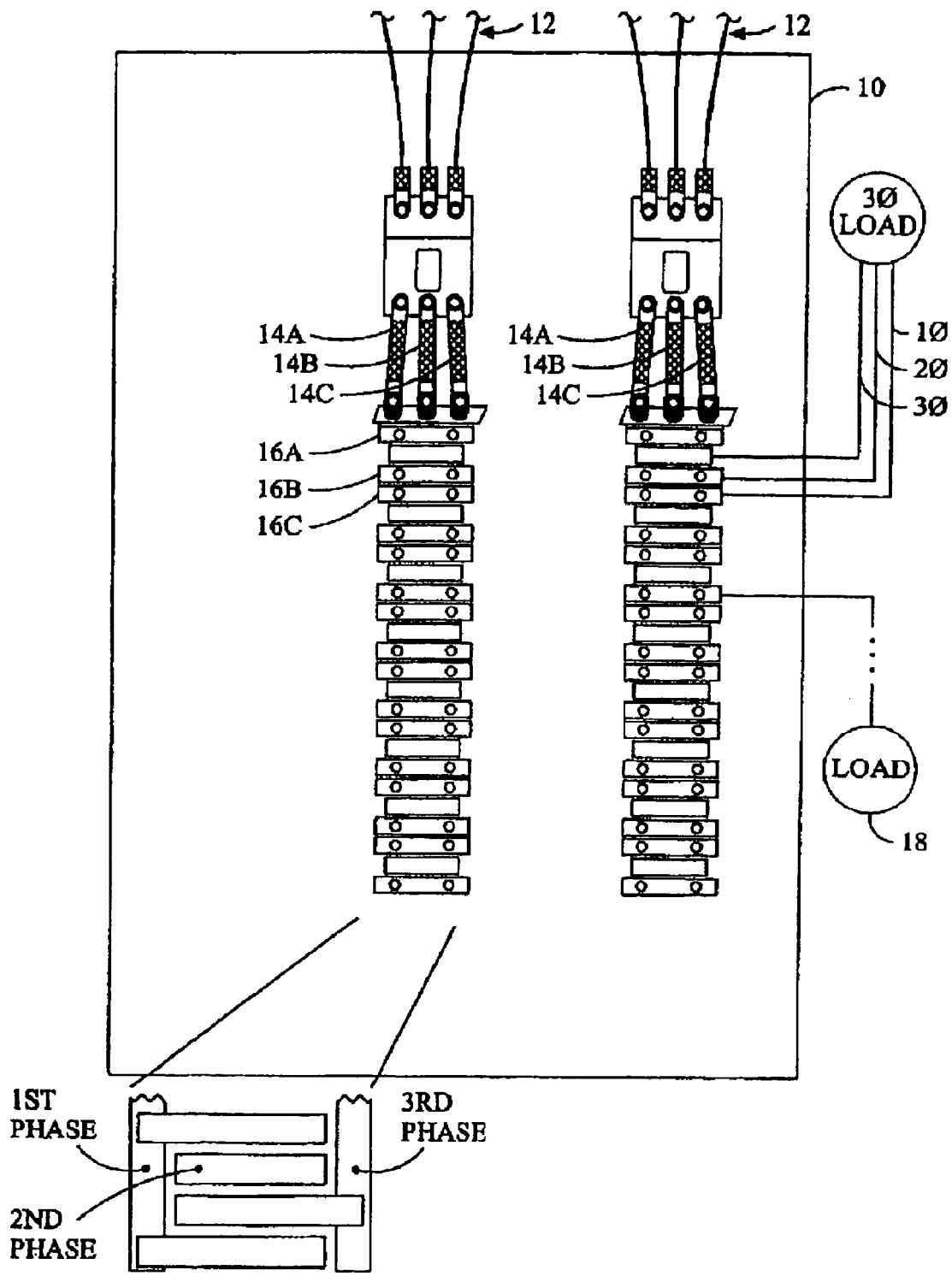
FIG. 1 illustrates a power panel with circuit breakers.
Figure 2:
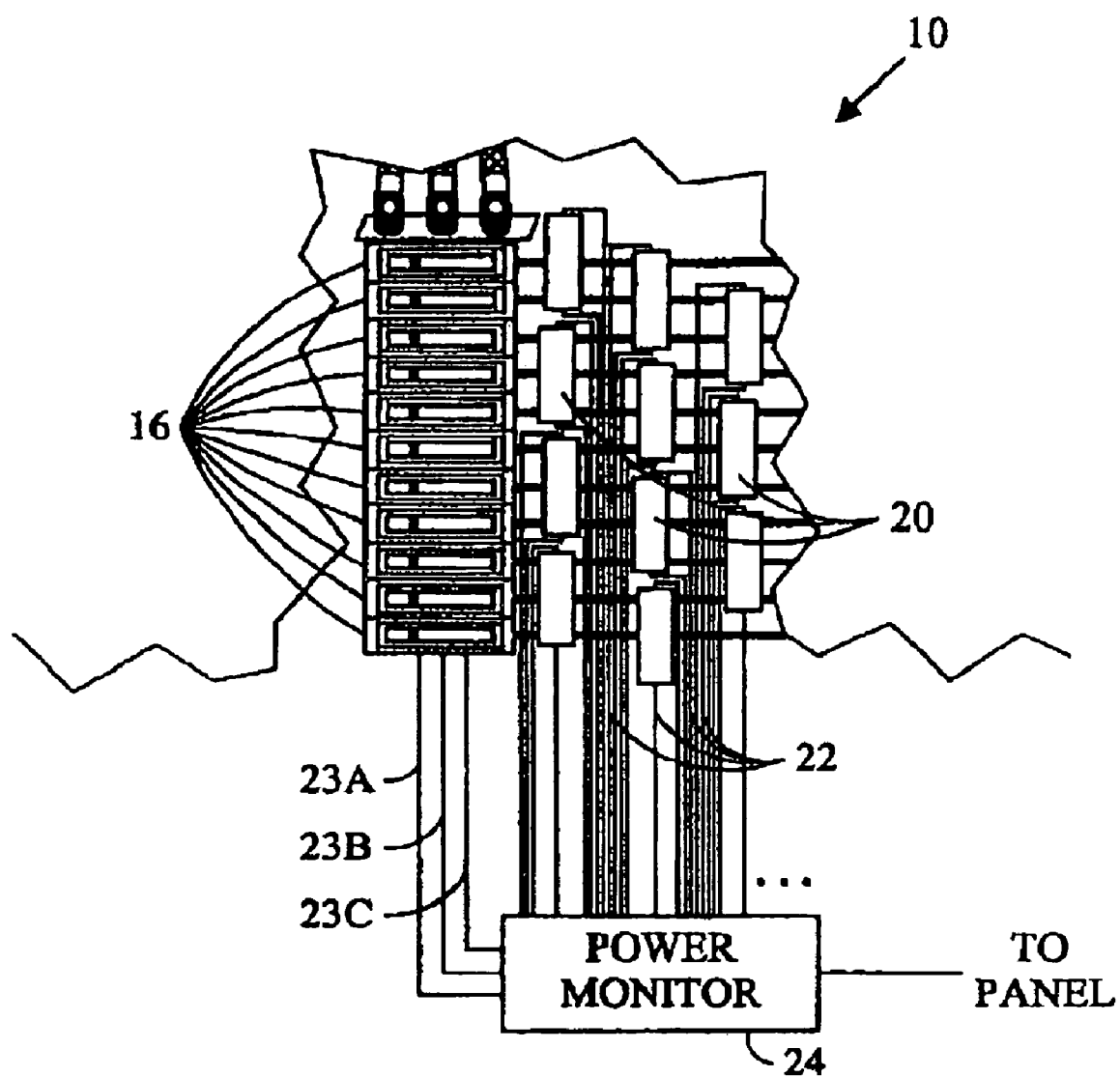
FIG. 2 illustrates circuit breakers, associated sensors, and a power monitor.
Figure 6:
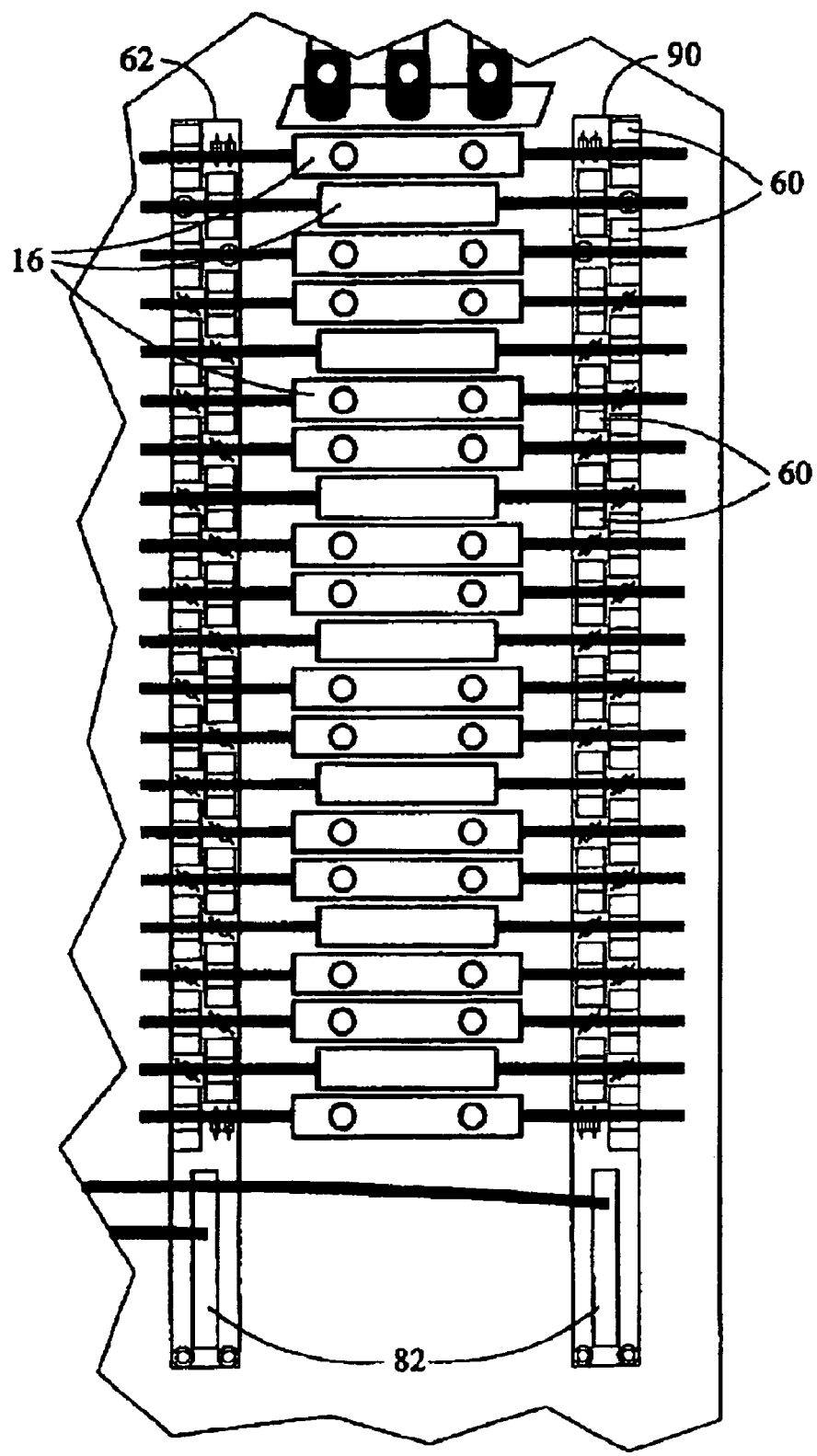
FIG. 6 illustrates a top view of the support and sensors of FIG. 2 together with circuit breakers.
Figure 7:
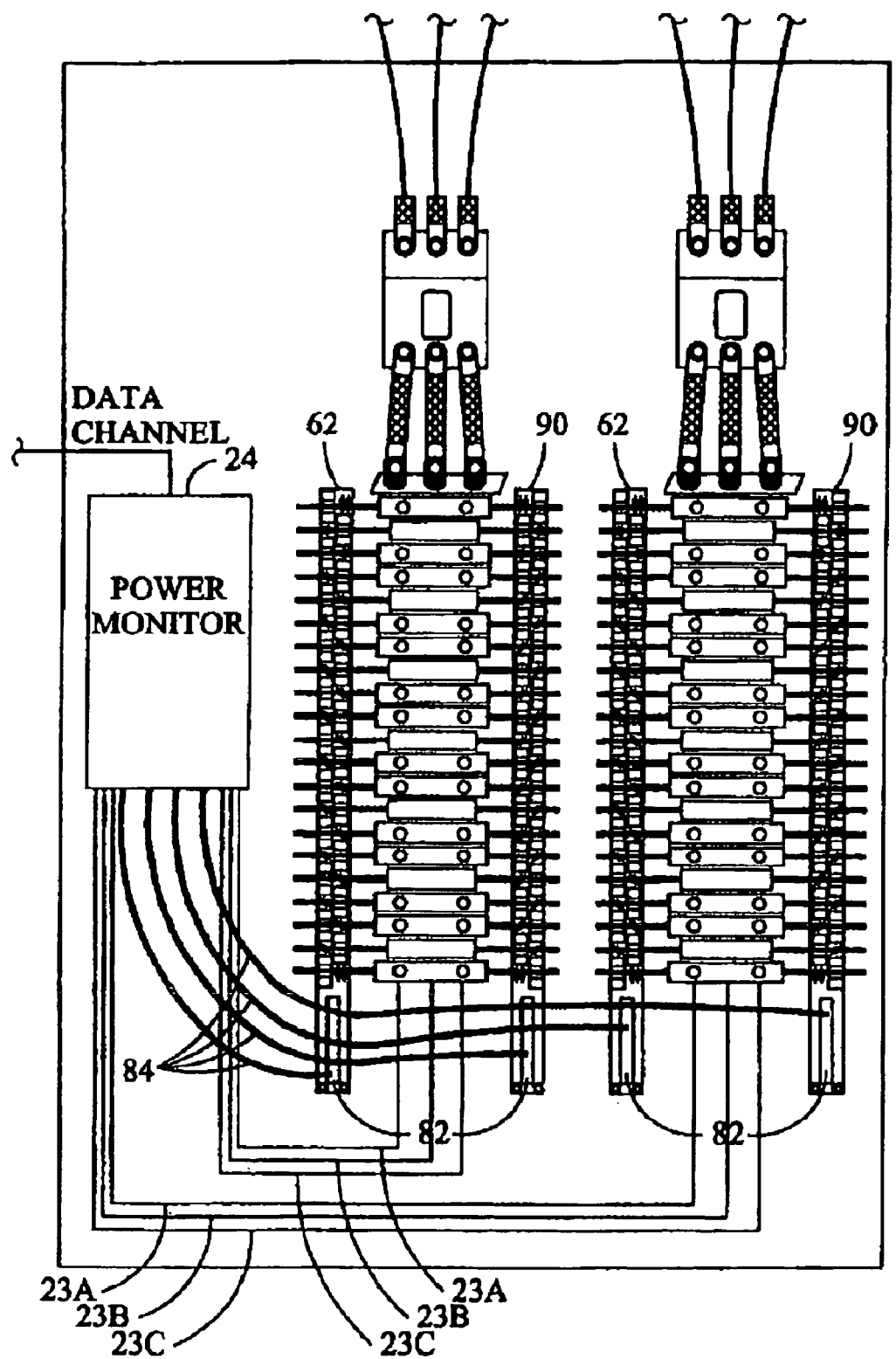
FIG. 7 illustrates a power panel assembly with a power monitor and the support/current sensors of FIG. 3.
Figure 8:
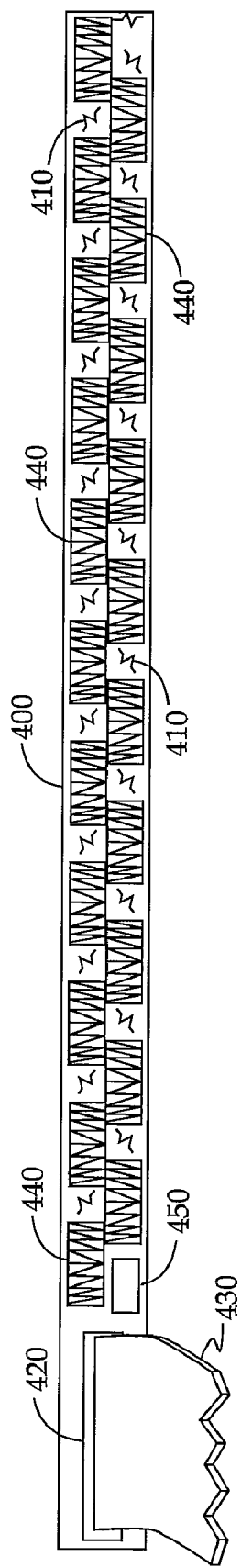
FIG. 8 illustrates a support with resistive elements.

Referring to FIG. 8, in order to modify the design to eliminate or otherwise reduce the number of transient voltage suppressors, it is desirable to effectively move the burden resistor from the power meter board to the current sensor support 400 to replace the transient voltage suppressor. The transient voltage suppressors are replaced with primarily resistive elements 410. The transient voltage suppressors operate in a current mode so that there is no voltage drop on the cable connected to the connector 420, which reduces errors in the measurement. However, replacing the transient voltage suppressors with a corresponding resistor 410 results in a voltage drop across the resistors 410. Unlike the transient voltage suppressors operating in a current mode signal through the cable (e.g., connector), resistors operate in a voltage mode signal through the cable. With a suitable resistive value, such as 15 ohms, the resistors 410 can effectively suppress transient voltages in a similar manner to the transient voltage suppressors. By way of example, the restive value may be less than 30 ohms, or less than 15 ohms. Resistors tend to be considerably more cost effective than transient voltage suppressors. In general, the resistors may be directly supported by the support, or otherwise supported by the current transformer which is considered supported by the support, or otherwise located at any location supported, directly or indirectly, by the support. In some cases it may be desirable to include some transient voltage suppressors, but in general, there may be less transient voltage suppressors than there would otherwise have been. This is especially true with those current transformers associated with a corresponding primarily resistive element.

With the addition of the resistors 410 on the current sensor support 400, each of which is associated with a respective current transformer 440, the resulting signal across the cable 430 would include a voltage drop because the resistor has effectively changed the operation of the circuitry to a voltage mode, rather than a current mode. One or more resistors may be associated with one or more current transformers, as desired. Thus with the addition of primarily resistive elements on the current sensor support 400 (preferably with the elimination of the associated transient voltage suppressors), the system then has introduced a potential source for a significant error in the measurement due to the voltage drop across the cable 430 (e.g., a ribbon cable or any other type of connector).

Figure 9:
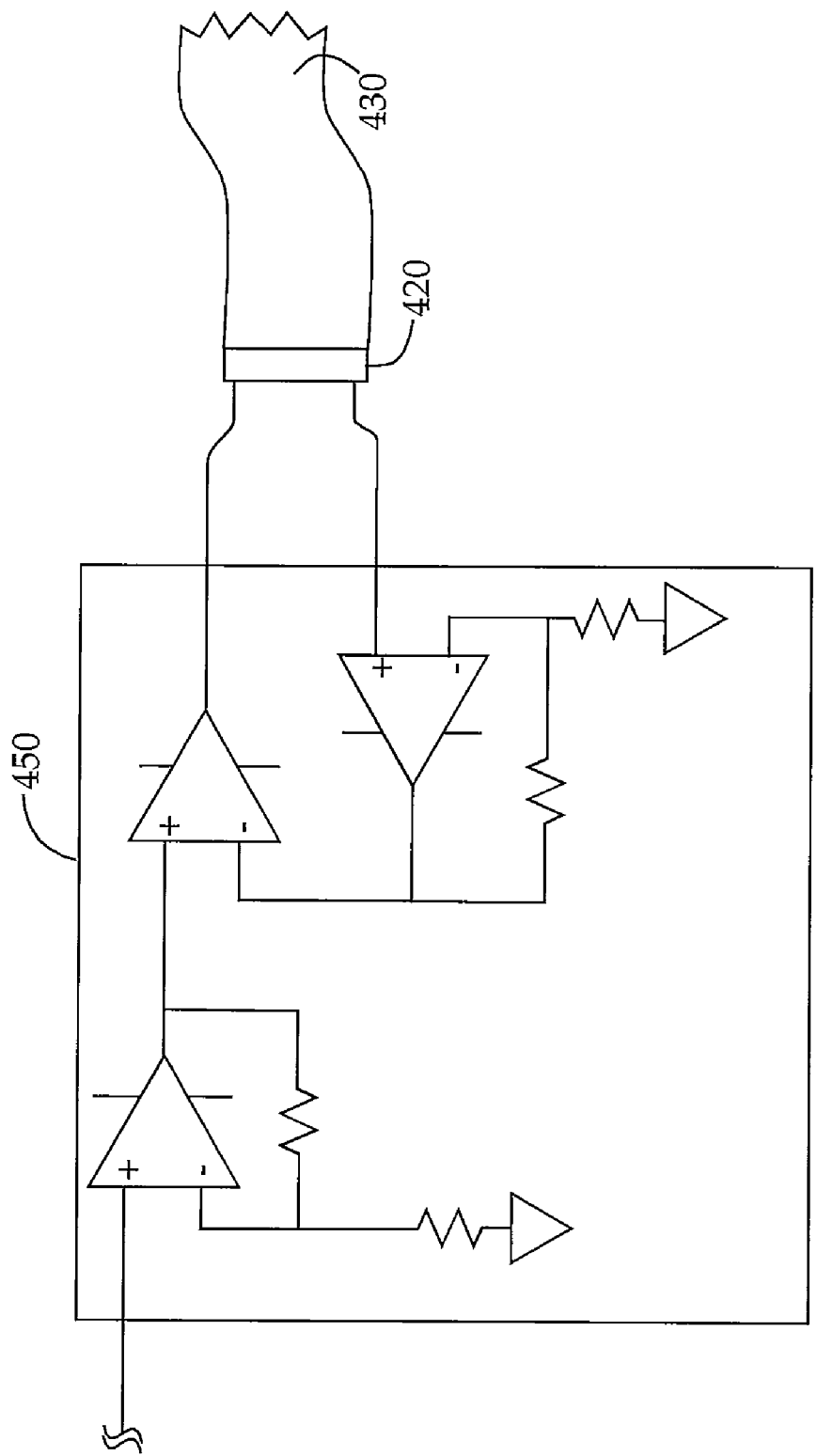
FIG. 9 illustrates a voltage to current converter.

Referring to FIG. 9, to reduce the voltage drop across the cable, the system may further include a voltage to current converter 450 electrically connected between the current transformer 440 and the cable 430 to provide a current mode signal across the cable 430. A voltage to current converter 450 may be provided for each current transformer, or selected groups of current transformers, or one for all of the current transformers. Any suitable type of voltage to current converter may be used. However, since each voltage to current converter 450 tends to be relatively expensive and requires considerable space on the current sensor support 400, the input of the voltage to current converter 450 is preferably multiplexed among a plurality of current transformers. Preferably, the cable 430 includes fewer signal lines than the number of current transformers supported by the support.

Figure 10:
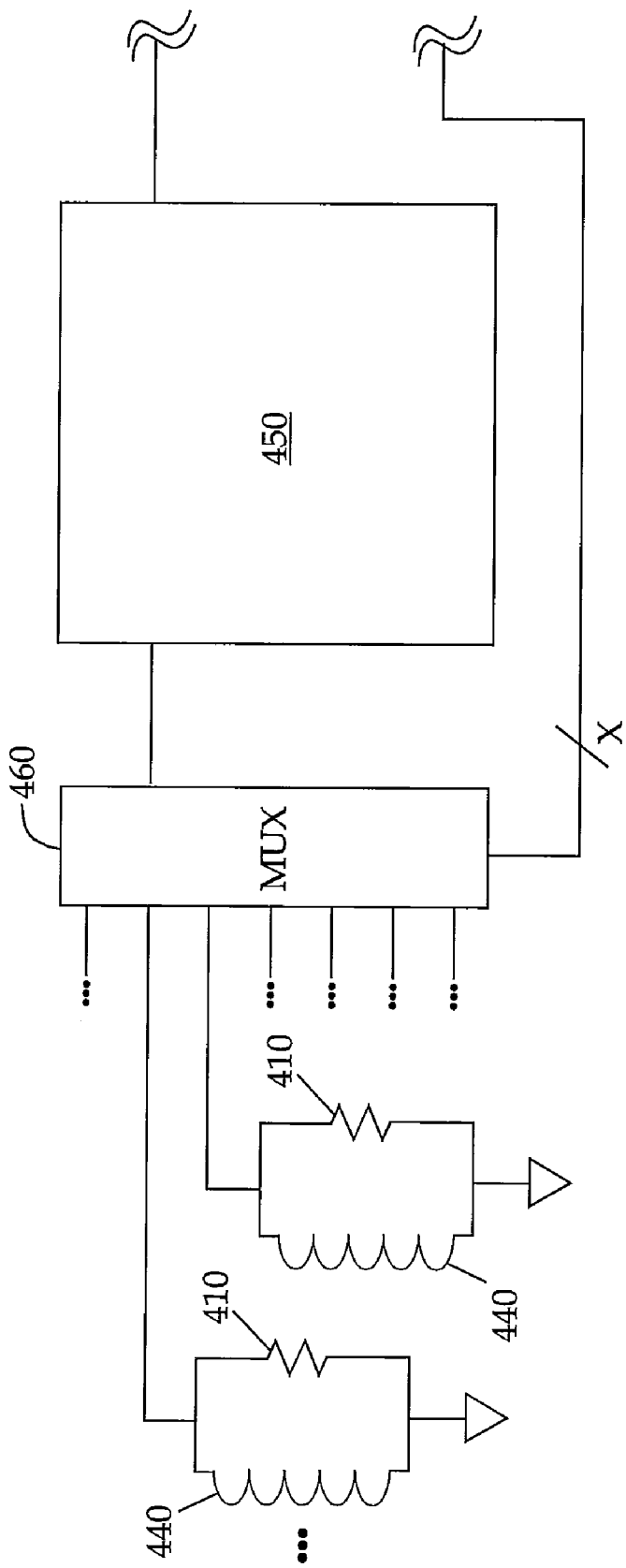
FIG. 10 illustrates a multiplexer and a voltage to current converter.

Referring to FIG. 10, a single voltage to current converter 450, or otherwise a selected number of voltage to current converters may be used. Multiple voltage to current converters 450 facilitate increased bandwidth, and potential redundancy. A multiplexer 460 may be used to select among a plurality of the current transformers 440. In some cases, multiple multiplexers may be used to select among multiple current transformers and/or multiple voltage-to-current converters. As such the many to one multiplexer 460 may select an output of a current transformer, which is a voltage signal, which is then converted by the voltage to current converter 450. The resulting current signal from the converter 450 is provided to the cable 430. In this manner, a current mode signal is provided to the cable 430 which is not susceptible to incurring a signal degrading voltage drop thereby reducing measurement accuracy. The multiplexer 460 may likewise select more than one input signal and provide one or more output signals, which are passed through a voltage to current converter 450. In some cases, the system may encode or otherwise provide data regarding multiple current transformers in a serial or inter-woven approach.

The selected inputs and output(s) of the multiplexer 460 may be controlled by one or more control lines 470. The control lines 470 may be supplied by a control signal on the current sensor support 400 or the power meter board through the cable 430. In some cases, the multiplexer may select the signals in a predetermined manner so that no control signals are needed from the power meter board. In some cases, the system may encode digital data in the transmission to provide an identification of the current transformer. This reduces the likelihood of errors in the selection of data.

Figure 11:
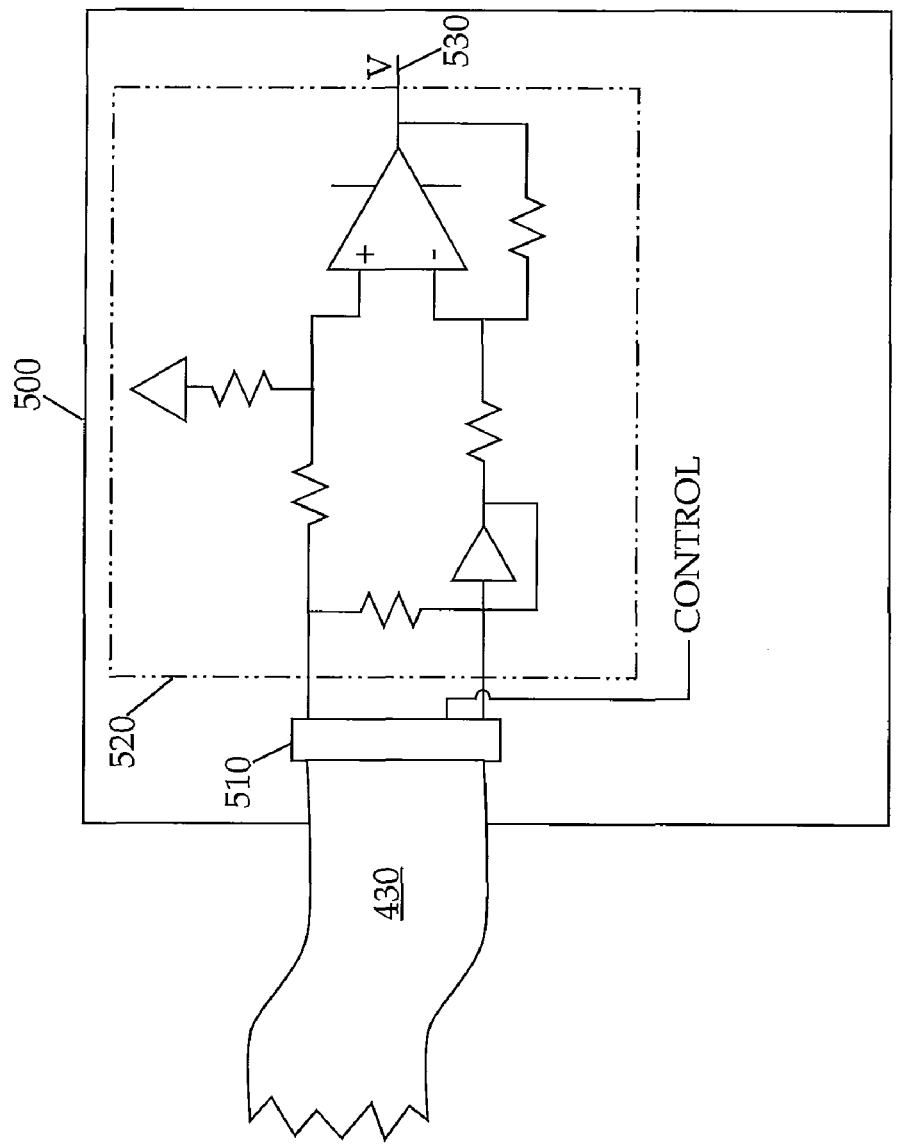
FIG. 11 illustrates a current to voltage converter.

Referring to FIG. 11, while the current transformers and associated circuitry converts a voltage mode signal to a current mode signal before sending the signal through the cable 430, the power meter board 500 should likewise include corresponding circuitry to receive the current signal. The received current signal on the cable 430 is connected to a connector 510. The connector 510 is then electrically connected to a current to voltage converter 520. The current to voltage converter 520 provides a voltage output 530. The voltage output 530 is provided to the current monitor/power monitor as previously described. In some cases, multiple current to voltage converters 520 may be used, as desired. In some cases, the measurement system may be suitable to use the current signal directly, alleviating the need for a current to voltage converter 520.

With suitable timing, data provided together with the current signals, or otherwise control lines from the power meter board to the current transformer circuitry, the data may be identified. Alternatively, the data provided from the current transformers may be sequenced so that the power meter will know what current transformer the data is associated with. By way of example, one or more lines in the cable 430 may be signal lines, a line may be used for providing power, a line may be used as a ground line, and one or more lines may be used as control lines for the multiplexer(s).

In an alternative embodiment the power factor for one or more phases may be presumed to be a constant value. The power factor (normally the cosine of the phase difference) may be based upon historical measurements, test measurements, anticipated power factor, desired power factor, or otherwise omitted from the calculation of power usage (equivalent to using a power factor of "1").

In an alternative embodiment the power factor, the voltage potential, and/or the current may be calculated, sensed, or otherwise measured for a single phase of a multi-phase load. The power monitor may then use the voltage potential and current, together with the power factor if desired, to calculate the power usage of a multi-phase load by presuming that the remaining phases have similar characteristics. For example, in a three phase system the remaining phases may be presumed to have approximately a 60 degree phase difference. Reusing power calculations for other phases reduces the computation complexity of the power monitor while maintaining relatively accurate power measurements.

In an alternative embodiment, the power factor of a multiphase load may be determined based upon one of the voltages and one of the currents, both of which are preferably associated with the same phase. The power factor may then be used for all of the phases, if desired. Reusing the calculated power factor reduces the computational complexity of the power monitor while maintaining relatively accurate power measurements.

In an alternative embodiment, the power monitor may, if desired, separate multiple summed alternating voltage signals into their respective phases for power determination, typically by decomposition of the composite signal.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. A monitoring system comprising:
    (a) a support supporting at least four current transformers thereon;
    (b) at least one resistive element electrically connected to at least a respective one of said current transformers suitable for voltage suppression, and said at least one resistive element supported by said support;
    (c) wherein said at least four current transformers are free from including an associated transient voltage suppressor;
    (d) a voltage-to-current converter suitable to convert a voltage mode signal from at least one of said at least four current transformers to a current mode signal;
    (e) a power monitor is electrically interconnected by a cable to said support which receives said current mode signal from said voltage-to-current converter;
    (f) said power monitor calculates the power associated with at least a respective one of said current transformers based upon said received current mode signal.

2. The monitoring system of claim 1 wherein said cable includes fewer signal lines than the number of current transformers supported by said support.

3. The monitoring system of claim 1 wherein said power monitor is free from including a burden resistor associated with a plurality of signal lines associated with said cable.

4. The monitoring system of claim 1 wherein said power meter is free from including burden resistors associated with a plurality of signal lines associated with said cable.

5. The monitoring system of claim 1 wherein said at least one resistive element is less than 30 ohms.

6. The monitoring system of claim 1 wherein said at least one resistive element is less than 15 ohms.

* * * * *